(12) United States Patent
Scott et al.

(10) Patent No.: US 10,270,437 B2
(45) Date of Patent: Apr. 23, 2019

(54) RF SWITCH HAVING REDUCED SIGNAL DISTORTION

(71) Applicant: Qorvo US, Inc., Greensboro, NC (US)

(72) Inventors: Baker Scott, San Jose, CA (US);
George Maxim, Saratoga, CA (US);
Dirk Robert Walter Leipold, San Jose, CA (US); Daniel Charles Kerr, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/294,337

(22) Filed: Oct. 14, 2016

(65) Prior Publication Data

US 2017/0201248 A1    Jul. 13, 2017

Related U.S. Application Data

(60) Provisional application No. 62/276,429, filed on Jan. 8, 2016.

(51) Int. Cl.
| | |
|---|---|
| *H03F 1/22* | (2006.01) |
| *H03K 17/16* | (2006.01) |
| *H03K 17/68* | (2006.01) |
| *H03F 3/04* | (2006.01) |
| *H03K 17/14* | (2006.01) |
| *H03K 17/693* | (2006.01) |

(52) U.S. Cl.
CPC ......... *H03K 17/145* (2013.01); *H03K 17/693* (2013.01)

(58) Field of Classification Search
CPC ............................ H03K 17/145; H03K 17/693

USPC ............................... 327/365–508; 326/1–136
See application file for complete search history.

(56) References Cited

U.S. PATENT DOCUMENTS

| | | | |
|---|---|---|---|
| 7,345,521 B2 | 3/2008 | Takahashi et al. | |
| 7,459,988 B1 | 12/2008 | Iversen | |
| 8,373,490 B2 * | 2/2013 | Burgener | H03C 1/36 327/361 |
| 8,461,903 B1 | 6/2013 | Granger-Jones | |
| 8,723,260 B1 | 5/2014 | Carroll et al. | |

(Continued)

OTHER PUBLICATIONS

Non-Final Office Action for U.S. Appl. No. 15/585,345, dated Feb. 23, 2018, 5 pages.

(Continued)

*Primary Examiner* — Brandon S Cole
(74) *Attorney, Agent, or Firm* — Withrow & Terranova, P.L.L.C.

(57) ABSTRACT

An RF switch having an M number of FETs that are stacked in series and coupled between a first end node and a second end node wherein each of the M number of FETs has a gate is disclosed. A resistive network is coupled between a common mode (CM) node and the gate for each of the M number of FETs such that a resistance between the CM node and each gate of the M number of FETs is substantially equal. Biasing circuitry coupled to the CM node is configured to sense a breakdown current flowing through the CM node, and in response to the breakdown current, generate a compensation signal that counters deviations of drain to source voltage across individual ones of the M number of FETs due to an applied RF voltage across the M number of FETs while the RF switch is in an OFF state.

21 Claims, 5 Drawing Sheets

(56) References Cited

U.S. PATENT DOCUMENTS

| | | | |
|---|---|---|---|
| 8,779,859 B2* | 7/2014 | Su | H03F 3/193 |
| | | | 330/311 |
| 9,048,836 B2 | 6/2015 | Maxim et al. | |
| 9,143,124 B2 | 9/2015 | Cam et al. | |
| 9,190,994 B2 | 11/2015 | Hurwitz | |
| 9,214,932 B2 | 12/2015 | Clausen et al. | |
| 9,628,075 B2 | 4/2017 | Cebi et al. | |
| 9,667,244 B1* | 5/2017 | Cavus | H03K 17/687 |
| 9,712,158 B1* | 7/2017 | Cavus | H03K 17/687 |
| 9,843,293 B1* | 12/2017 | Wagh | H03F 1/0261 |
| 9,948,281 B2 | 4/2018 | Ranta | |
| 9,960,737 B1* | 5/2018 | Kovac | H03F 1/0266 |
| 9,979,387 B2* | 5/2018 | Wu | H03K 17/6872 |
| 2003/0181167 A1* | 9/2003 | Iida | H04B 1/005 |
| | | | 455/78 |
| 2006/0194558 A1* | 8/2006 | Kelly | H03K 17/6871 |
| | | | 455/319 |
| 2008/0265978 A1* | 10/2008 | Englekirk | H03K 17/102 |
| | | | 327/427 |
| 2011/0025404 A1* | 2/2011 | Cassia | H03K 17/08122 |
| | | | 327/436 |
| 2012/0049956 A1* | 3/2012 | Lam | H03F 1/0272 |
| | | | 330/253 |
| 2013/0278317 A1* | 10/2013 | Iversen | H03H 21/0007 |
| | | | 327/308 |
| 2014/0009214 A1* | 1/2014 | Altunkilic | H03K 17/161 |
| | | | 327/427 |
| 2014/0253217 A1 | 9/2014 | Briere | |
| 2015/0270806 A1* | 9/2015 | Wagh | H03F 3/211 |
| | | | 330/296 |
| 2015/0381171 A1 | 12/2015 | Cebi et al. | |
| 2016/0329891 A1* | 11/2016 | Bakalski | H03K 17/693 |
| 2017/0201244 A1 | 7/2017 | Kerr | |
| 2017/0272066 A1 | 9/2017 | Scott et al. | |
| 2018/0145678 A1* | 5/2018 | Maxim | H03K 17/063 |
| 2018/0167062 A1 | 6/2018 | Shanjani et al. | |

OTHER PUBLICATIONS

Lu, Jian et al., "Modeling, Design, and Characterization of Multiturn Bondwire Inductors With Ferrite Epoxy Glob Cores for Power Supply System-on-Chip or System-in-Package Applications," IEEE Transactions on Power Electronics, vol. 25, No. 8, Aug. 2010, pp. 2010-2017.

Non-Final Office Action for U.S. Appl. No. 15/849,074, dated Jul. 30, 2018, 8 pages.

Non-Final Office Action for U.S. Appl. No. 15/401,936, dated Sep. 12, 2018, 14 pages.

Final Office Action for U.S. Appl. No. 15/401,936, dated Feb. 26, 2019, 14 pages.

Notice of Allowance for U.S. Appl. No. 15/849,074, dated Jan. 25, 2019, 7 pages.

* cited by examiner

RF SWITCH HAVING REDUCED SIGNAL DISTORTION

RELATED APPLICATIONS

This application claims the benefit of provisional patent application Ser. No. 62/276,429, filed Jan. 8, 2016, the disclosure of which is hereby incorporated herein by reference in its entirety.

FIELD OF THE DISCLOSURE

The present disclosure relates to reducing noise generated by RF switches that are in the OFF state while blocking an applied RF signal.

BACKGROUND

Stacked RF field effect transistors (FET) switches can experience an early breakdown due to an applied RF signal that approaches a rated breakdown combined with unbalanced drain to source voltages. The early breakdown results in bulk-drain diode and bulk-source diode reverse currents. In the case of local bias switching of bulk-drain and bulk-source diodes of a FET that is undergoing early breakdown, a breakdown current will propagate through gate bias resistors that bias the FET. In cases such as RF FET switches used in high-Q programmable array capacitor (PAC) circuits, the gate bias resistors have relatively large values that are between hundreds of kilo-ohms and mega-ohms. Thus, having early breakdown current in a μA range can result in relatively large voltage drops across the gate bias resistors. Since the breakdown current is dependent on the applied RF signal level, proportional RF distortions that add to the applied RF signal will occur. RF distortions are undesirable, thus, there is a need for an RF switch that reduces the RF distortions caused by early breakdown current.

SUMMARY

An RF switch having reduced signal distortion is disclosed. The RF switch has an M number of FETs that are stacked in series and coupled between a first end node and a second end node wherein M is a finite number greater than one and each of the M number of FETs has a gate. A resistive network is coupled between a common mode (CM) node and the gate for each of the M number of FETs such that a resistance between the CM node and each gate of the M number of FETs is substantially equal. Biasing circuitry coupled to the CM node is configured to sense a breakdown current flowing through the CM node, and in response to the breakdown current, generate a compensation signal that counters deviations of drain to source voltage across individual ones of the M number of FETs due to an applied RF voltage across the M number of FETs while the RF switch is in an OFF state.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
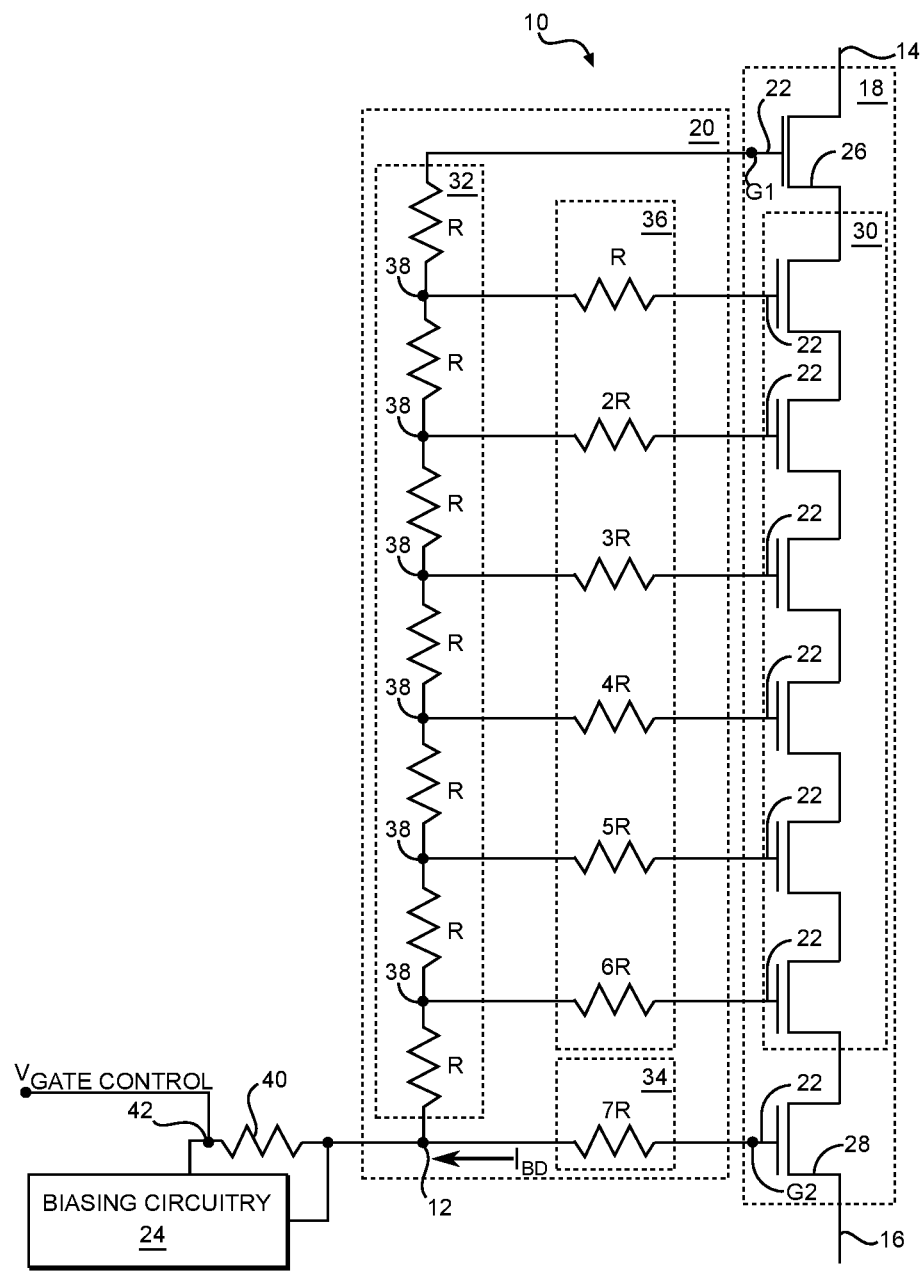
FIG. 1 is a circuit schematic diagram of a first exemplary embodiment of an RF switch that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, the phrase substantially equal when referring to resistance values means having resistance values within ±10% of each other.

FIG. 1 is a circuit schematic diagram of an exemplary embodiment of an RF switch 10 that is structured in accordance with the present disclosure. In this exemplary embodiment, the RF switch 10 is provided in a single ended configuration having a common mode (CM) node 12, a first end node 14, and a second end node 16. The RF switch 10 has an M number of field effect transistors (FETs) 18 that are stacked in series and coupled between the first end node 14 and the second end node 16. Generally, M is a finite integer greater than one. The RF switch 10 depicted in FIG. 1 includes eight FETs stacked in series, thus, M is equal to eight in this exemplary case. Each of the M number of FETs 18 has a gate 22 for switching each of the M number of FETs 18 between an OFF state and an ON state. The M number of FETs 18 is transitioned to an ON state to pass an RF current resulting from an applied voltage $V_{RF}$ through the RF switch 10. In contrast, the M number of FETs 18 is transitioned to an OFF state to block RF signal current from flowing through the RF switch 10. Operationally, when a $V_{GATE\ CONTROL}$ signal is asserted, the M number of FETs 18 is turned on. When the $V_{GATE\ CONTROL}$ signal is de-asserted, the M number of FETs 18 is turned OFF. The M number of FETs 18 may be, for example, silicon on insulator (SOI) FETs, High Electron Mobility Transistors (HEMTs), or silicon on sapphire (SOS) FETs.

A resistive network 20 is coupled between the CM node 12 and the gate 22 for each of the M number of FETs 18. The resistive network 20 is configured such that a resistance between the CM node 12 and each gate 22 of the M number of FETs 18 is substantially equal.

Biasing circuitry 24 coupled to the CM node 12 is configured to sense breakdown current $I_{BD}$ flowing through the CM node 12. In response to the breakdown current $I_{BD}$, the biasing circuitry 24 is further configured to generate a compensation signal that counters deviations of drain to source voltage across individual ones of the M number of FETs 18 due to the applied RF voltage $V_{RF}$ across the M number of FETs 18 while the RF switch 10 is in the OFF state.

Looking at FIG. 1 in greater detail, the M number of FETs 18 is configured into a single ended version of RF switch 10. This exemplary embodiment includes a first end FET 26 that is coupled to the first end node 14. The first end FET 26 includes a first gate $G_1$. An $M^{th}$ end FET 28 is coupled to the second end node 16 and includes a second gate $G_2$. M−2 FETs 30 are stacked in series with and in between the first end FET 26 and the $M^{th}$ end FET 28. In this exemplary case the number of M−2 FETS 30 is six.

There are also M−1 bias resistors 32 coupled in series between the first gate G1 and the CM node 12. Each of the M−1 bias resistors 32 has a resistance of substantially R. The RF switch 10 further includes a first gate resistor 34 coupled in series between the second gate $G_2$ and the CM node 12. Generally, the first gate resistor 34 has a resistance of substantially (M−1)·R. In the exemplary embodiment depicted in FIG. 1, the resistance of the first gate resistor 34 equals (8−1)·R, which is 7R.

Further included are M−2 gate resistors 36. Each of the M−2 gate resistors 36 is coupled between a gate 22 of one of the M−2 FETs 30 and one of a connection node 38 situated between adjacent ones of the M−1 bias resistors 32. When progressing from the first end node 14 to the second end node 16, successive ones of the M−2 gate resistors 36 has a resistance that increases by R. A common mode resistor 40 ($R_{CM}$) having a relatively large resistance compared to R is coupled between the CM node 12 and a control node 42. The control node 42 receives both the $V_{GATE\ CONTROL}$ signal and the breakdown current $I_{BD}$ flowing through the CM node 12.

Figure 2:
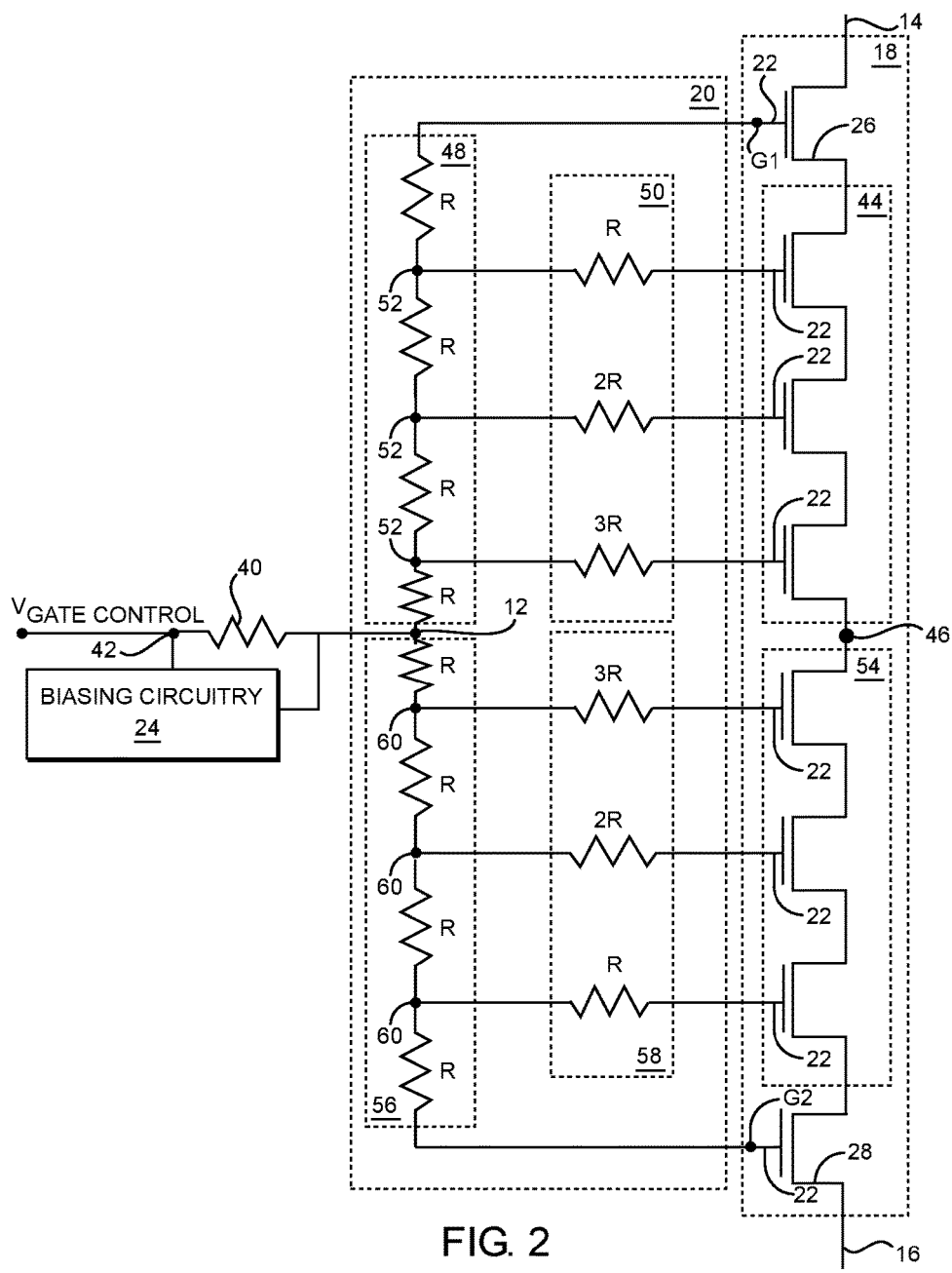
FIG. 2 is a circuit schematic diagram of a second exemplary embodiment of an RF switch that is structured in accordance with the present disclosure.

FIG. 2 is a schematic of the RF switch 10 in a differential configuration. In this exemplary embodiment, the first end FET 26 is coupled to the first end node 14 and has a first gate G1. In this particular configuration, there are M/2−1 first FETs 44 stacked in series with and in between the first end FET 26 and a middle node 46. M/2 first bias resistors 48 are coupled in series between the first gate G1 and the CM node 12. Each of the M/2 first bias resistors 48 have a resistance of substantially R. Also included are M/2−1 first gate resistors 50. Each of the M/2−1 first gate resistors 50 is coupled between a gate 22 of one of the M/2−1 first FETs 44 and a connection node 52 between adjacent ones of the M/2 first bias resistors 48. Successive ones of the M/2−1 first gate resistors 50 has a resistance that increases by R when progressing from the first end node 14 to the middle node 46.

The differential configuration further includes the $M^{th}$ end FET 28 coupled to the second end node 16 and having a second gate G2. In this particular configuration, there are M/2−1 second FETs 54 stacked in series with and in between the $M^{th}$ end FET 28 and the middle node 46. M/2 second bias resistors 56 are coupled in series between the second gate G2 and the CM node 12. Each of the M/2 second bias resistors 56 has a resistance of substantially R. Also included are M/2−1 second gate resistors 58. Each of the M/2−1 second gate resistors 58 is coupled between a gate 22 of one of the M/2−1 second FETs 54 and a connection node 60 between adjacent ones of the M/2 second bias resistors 56. Successive ones of the M/2−1 second gate resistors 58 has a resistance that increases by R when progressing from the second end node 16 to the middle node 46.

Figure 3:
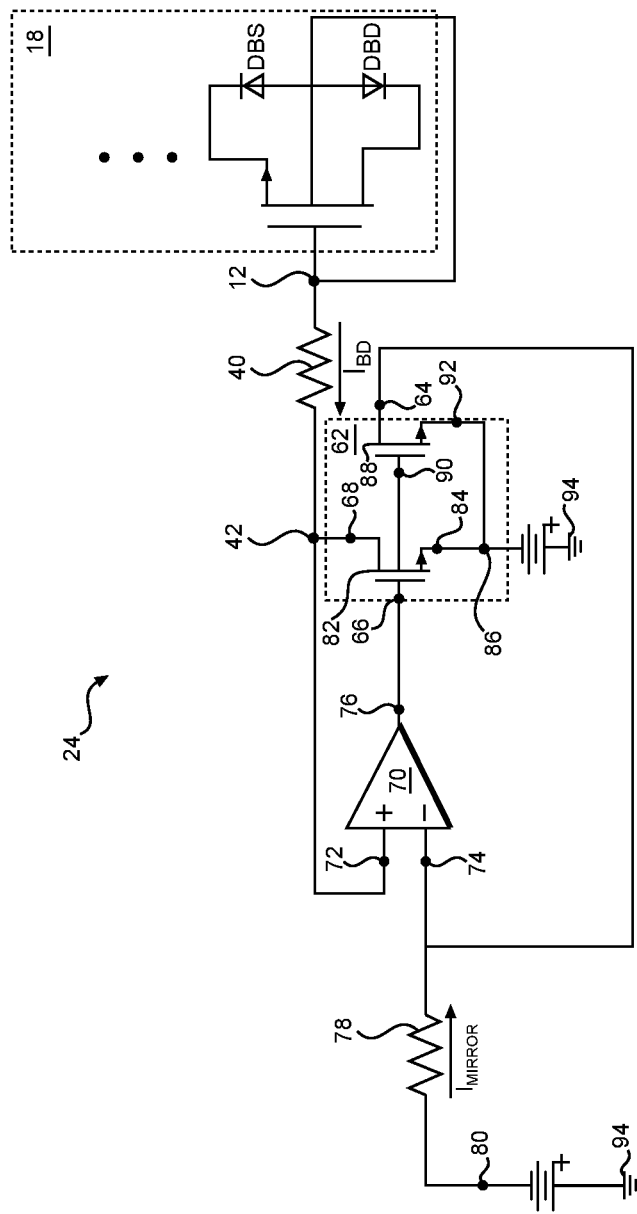
FIG. 3 is a schematic of a first embodiment of biasing circuitry in which a current mirror is employed in compensating a voltage drop created by breakdown current.

FIG. 3 is a schematic of a first embodiment of the biasing circuitry 24 in which a current mirror 62 is employed in compensating for a voltage drop created by breakdown current $I_{BD}$. In particular, this first embodiment of the biasing circuitry 24 compensates for the voltage drop caused by the breakdown current $I_{BD}$ by first sensing the breakdown current $I_{BD}$ flowing through the CM node 12 and then in response, generates a compensation signal that is opposite in polarity but of equal magnitude voltage to the voltage drop.

Structurally, the current mirror 62 includes a mirror output 64, a drive input 66, and a drive output 68 coupled to the control node 42. An operational amplifier (op-amp) 70 has a non-inverting input 72 coupled to the control node 42, an inverting input 74 coupled to the mirror output 64, and an op-amp output 76 coupled to the drive input 66. A compensation resistor 78 ($R_{COMP}$) is coupled between the inverting input 74 and a first fixed voltage node 80.

In this exemplary first embodiment, the current mirror 62 is made up of a drive FET 82 having the drive input 66, the drive output 68, and a drive source 84 coupled to a second fixed voltage node 86. The current mirror 62 also includes a mirror FET 88 having the mirror output 64, and a mirror gate 90 coupled to the op-amp output 76, and a mirror source 92 coupled to the second fixed voltage node 86. As depicted in this first exemplary embodiment, the drive FET 82, and the mirror FET 88 are both n-channel FETs. As such, the first fixed voltage node 80 and the second fixed voltage node 86 are typically at a negative potential with respect to a ground node 94.

In operation, the compensation signal $V_{COMP}$ is applied at the control node 42 rather than at the CM node 12 so that the intervening resistance of the common mode resistor 40 ($R_{CM}$) substantially attenuates undesirable RF signals that would complicate operation. In order to generate the compensation signal $V_{COMP}$, the breakdown current $I_{BD}$ flowing through the drive FET 82 is mirrored in the mirror FET 88. The mirrored current $I_{MIRROR}$ flows through the compensation resistor 78 to generate the compensation signal $V_{COMP}$ in accordance with equation 1.

$$V_{COMP} = R_{COMP} * I_{MIRROR} \quad \text{EQ. 1}$$

In order to provide a magnitude for the compensation signal $V_{COMP}$ that is equal to the magnitude of a breakdown voltage $V_{IBD}$ due to the breakdown current $I_{BD}$ the following relationship is observed in equation 2.

$$V_{IBD} = I_{BD} * R_{CM} \quad \text{EQ. 2}$$

Thus, a necessary resistance value for the compensation resistor 78 ($R_{COMP}$) is given by the following relationship presented in equation 3.

$$R_{COMP} = R_{CM} * I_{BD} I_{MIRROR} \quad \text{EQ. 3}$$

However, this first embodiment of the biasing circuitry 24 must be supplied by a voltage source that has enough voltage margin (i.e., headroom) to follow fluctuations in the magnitude of the voltage $V_{IBD}$. If enough headroom is not available a second embodiment of the biasing circuitry 12 can be employed.

Figure 4:
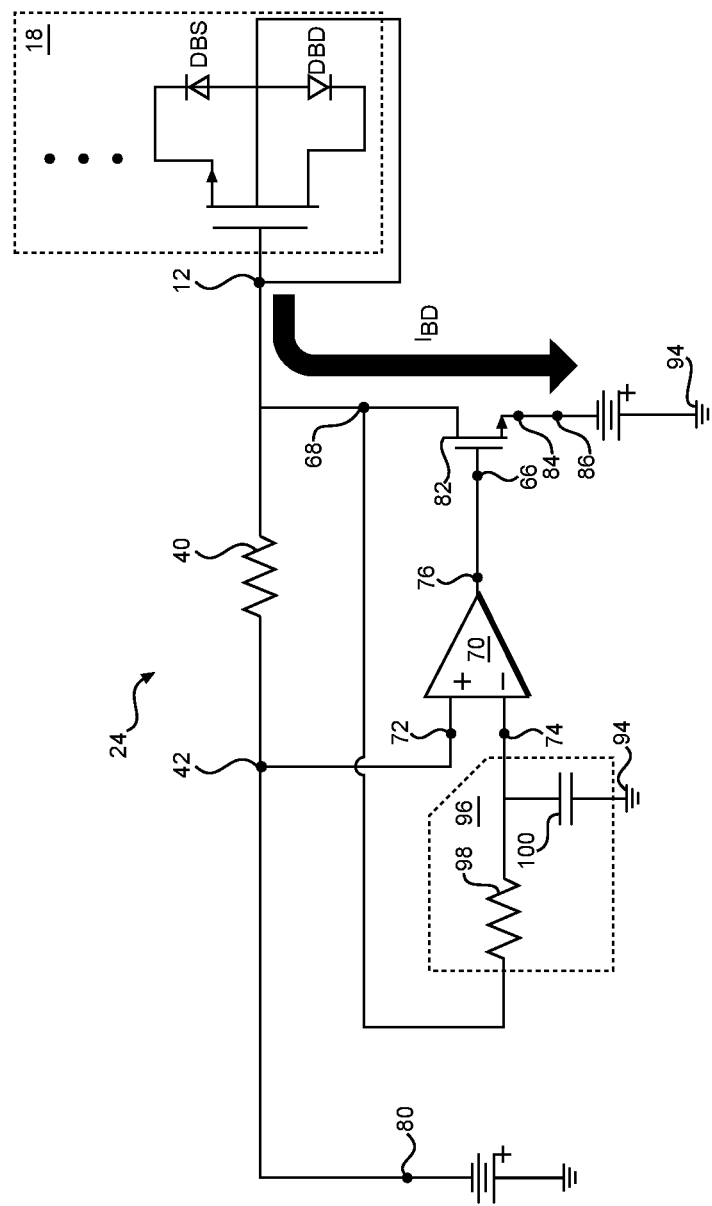
FIG. 4 is a schematic of a second embodiment of the biasing circuitry in which current deviation from the common mode resistor ($R_{CM}$) is employed to compensate for the breakdown current flowing through the common node.

FIG. 4 is a schematic of the second embodiment of the biasing circuitry 24 in which current deviation from the common mode resistor 40 ($R_{CM}$) is employed to compensate for the breakdown current $I_{BD}$ flowing through the CM node 12. To an extent that undesirable RF signals can be filtered out, a remaining DC component can be compared with a negative reference voltage applied to the first fixed voltage node 80. An advantage of this second embodiment of the biasing circuitry 24 is that there is no need for extra voltage margin, so headroom is not an issue. However, a slight disadvantage of the second embodiment of the biasing circuitry 24 is that sensing the breakdown current $I_{BD}$ from the CM node 12 requires a high order filter to attenuate the RF signal $V_{RF}$ to level substantially below the level of the voltage $V_{IBD}$.

Structurally, the drive FET 82 has the drive output 68 coupled to the CM node 12, the drive source 84 coupled to the second fixed voltage node 86, and the drive gate 66. The op-amp 70 has the non-inverting input 72 coupled to the control node 42, the inverting input 74 coupled to the drive output 68 through a low-pass filter 96, and the op-amp output 76 coupled to the drive gate 66. In the exemplary embodiment of FIG. 4, the low-pass filter 96 is made up of a filter resistor 98 coupled between the inverting input 74 and the drive output 68, and a filter capacitor 100 that is coupled to the ground node 94. Moreover, the control node 42 can have a negative DC bias by applying a negative potential to the first fixed voltage node 80, which in this case is the same node as the control node 42.

During operation, the op-amp 70 generates a compensation signal that drives the drive FET 82 to deviate the breakdown current $I_{BD}$ away from the relatively larger resistance of the common mode resistor 40 ($R_{CM}$). Not allowing the breakdown current $I_{BD}$ to flow through the common mode resistor 40 ($R_{CM}$) avoids a relatively larger contribution of undesirable voltage $V_{IBD}$.

Figure 5:
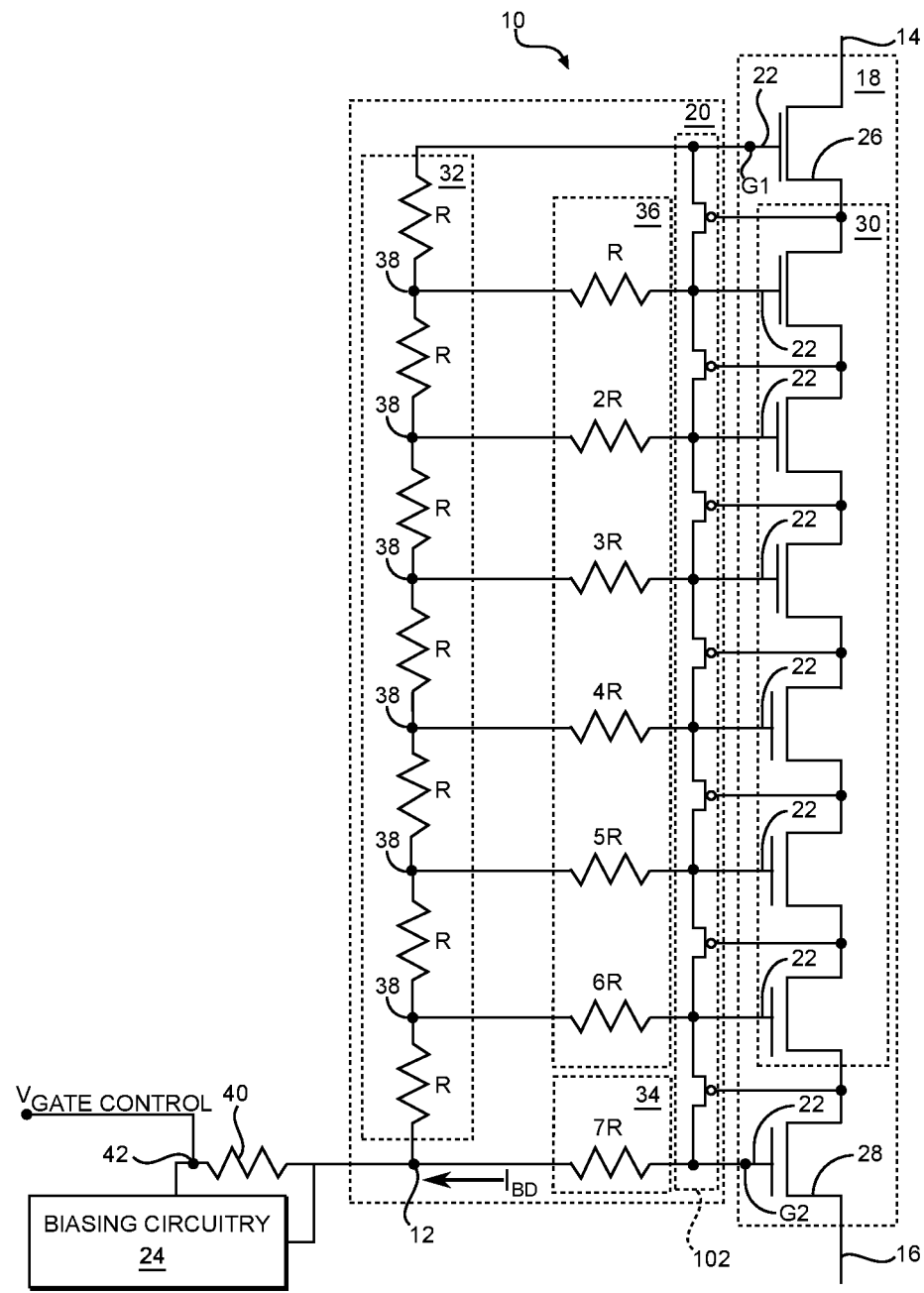
FIG. 5 is a circuit schematic diagram of the first exemplary embodiment of an RF switch of FIG. 1 that further includes a speed-up device that effectively shorts out the resistor network when the RF switch is transitioned to the ON state.

FIG. 5 is a circuit schematic diagram of the first exemplary embodiment of an RF switch 10 of FIG. 1 that further includes a speed-up device 102 that effectively shorts out the resistor network 20 when the RF switch 10 is transitioned to the ON state. The speed-up device 102 is made up of a chain of an M number of p-FETs that turn on as the RF switch 10 turns on. The M number of p-FETS stacked in series and coupled between the first gate G1 and the second gate G2. Each of the M number of p-FETs is coupled between adjacent ones of the gates of the M number of FETs 18. The speed-up device 102 has the advantage of eliminating relatively long RC time constants that result from turn-on current flowing through the resistor network 20 to charge parasitic capacitances associated with the M number of FETs 18.

Those skilled in the art will recognize improvements and modifications to the preferred embodiments of the present disclosure. All such improvements and modifications are considered within the scope of the concepts disclosed herein and the claims that follow.

What is claimed is:

1. An RF switch having a common mode (CM) node, a first end node, and a second end node comprising:
   an M number of FETs that are stacked in series and coupled between the first end node and the second end node wherein M is a finite number greater than one and each of the M number of FETs has a gate;
   a resistive network coupled between the CM node and the gate for each of the M number of FETs such that a resistance between the CM node and each gate of the M number of FETs is substantially equal; and
   biasing circuitry coupled to the CM node and configured to sense a breakdown current flowing through the CM node, and in response to the breakdown current, generate a compensation signal that counters deviations of drain to source voltage across individual ones of the M number of FETs due to an applied RF voltage across the M number of FETs while the RF switch is in an OFF state.

2. The RF switch of claim 1 wherein the M number of FETs comprise:
   a first end FET coupled to the first end node and having a first gate;
   an $M^{th}$ end FET coupled to the second end node and having a second gate; and M-2 FETs stacked in series with and in between the first end FET and the $M^{th}$ end FET;

M-1 bias resistors coupled in series between the first gate and the CM node, wherein each of the M-1 bias resistors have a resistance of substantially R;

a first gate resistor coupled between the second gate and the CM node and having a resistance of substantially (M-1)·R; and M-2 gate resistors wherein each of the M-2 gate resistors is coupled between a gate of one of the M-2 FETs and a connection node between adjacent ones of the M-1 bias resistors, wherein when progressing from the first end node to the second end node successive ones of the M-2 gate resistors has a resistance that increases by R.

3. The RF switch of claim 2 further including a CM mode resistor coupled between the CM node and a control node.

4. The RF switch of claim 3 wherein the biasing circuitry comprises:
a current mirror having a mirror output, a drive input, and a drive output coupled to the control node;
an operational amplifier (op-amp) having a non-inverting input coupled to the control node, an inverting input coupled to the mirror output, and an op-amp output coupled to the drive input; and
a compensation resistor coupled between the inverting input and a first fixed voltage node.

5. The RF switch of claim 4 wherein the current mirror comprises:
a drive FET having the drive input, the drive output, and a drive source coupled to a second fixed voltage node;
a mirror FET having the mirror output, a mirror gate coupled to the op-amp output, and a mirror source coupled to the second fixed voltage node.

6. The RF switch of claim 5 wherein the drive FET and the mirror FET are both n-channel FETs.

7. The RF switch of claim 5 wherein the first fixed voltage node and the second fixed voltage node are at a negative potential with respect to a ground node.

8. The RF switch of claim 3 wherein the biasing circuitry comprises:
a drive FET having a drive drain coupled to the CM node, a drive source coupled to a first fixed voltage node, and a drive gate;
an operational amplifier (op-amp) having a non-inverting input coupled to the control node, an inverting input, and an op-amp output coupled to the drive gate; and
a low-pass filter coupled between the drive drain and the inverting input.

9. The RF switch of claim 8 wherein the drive FET is an n-channel FET.

10. The RF switch of claim 9 wherein the first fixed voltage node is at a negative potential with respect to a ground node.

11. The RF switch of claim 2 further including a speed-up device comprising an M number of p-FETS that are stacked in series and coupled between the first gate and the second gate, and wherein each of the M number of p-FETs is coupled between adjacent gates of the M number of FETs.

12. The RF switch of claim 1 wherein the M number of FETs comprise:
a first end FET coupled to the first end node and having a first gate;
M/2-1 first FETs stacked in series with and in between the first end FET and a middle node;
M/2 first bias resistors coupled in series between the first gate and the CM node, wherein each of the M/2 first bias resistors have a resistance of substantially R; and
M/2-1 first gate resistors wherein each of the M/2-1 first gate resistors is coupled between a gate of one of the M/2-1 first FETs and a connection node between adjacent ones of the M/2 first bias resistors, wherein when progressing from the first end node to the middle node successive ones the M/2-1 first gate resistors has a resistance that increases by R.

13. The RF switch of claim 12 further comprising:
a second end FET coupled to the second end node and having a second gate;
M/2-1 second FETs stacked in series with and in between the second end FET and the middle node;
M/2 second bias resistors coupled in series between the second gate and the CM node, wherein each of the M/2 second bias resistors have a resistance of substantially R; and
M/2-1 second gate resistors wherein each of the M/2-1 second gate resistors is coupled between a gate of one of the M/2-1 second FETs and a connection node between adjacent ones of the M/2 second bias resistors, wherein when progressing from the second end node to the middle node successive ones of the M/2-1 second FETs each one of the M/2-1 second gate resistors has a resistance that increases by R.

14. The RF switch of claim 13 further including a CM mode resistor coupled between the CM node and a control node.

15. The RF switch of claim 14 wherein the biasing circuitry comprises:
a current mirror having a mirror output, a drive input, and a drive output coupled to the control node;
an operational amplifier (op-amp) having a non-inverting input coupled to the control node, an inverting input coupled to the mirror output, and an op-amp output coupled to the drive input; and
a compensation resistor coupled between the inverting input and a first fixed voltage node.

16. The RF switch of claim 15 wherein the current mirror comprises:
a drive FET having the drive input, the drive output, and a drive source coupled to a second fixed voltage node;
a mirror FET having the mirror output, a mirror gate coupled to the op-amp output, and a mirror source coupled to the second fixed voltage node.

17. The RF switch of claim 16 wherein the drive FET and the mirror FET are both n-channel FETs.

18. The RF switch of claim 16 wherein the first fixed voltage node and the second fixed voltage node are at a negative potential with respect to a ground node.

19. The RF switch of claim 14 wherein the biasing circuitry comprises:
a drive FET having a drive drain coupled to the CM node, a drive source coupled to a first fixed voltage node, and a drive gate;
an operational amplifier (op-amp) having a non-inverting input coupled to the control node, an inverting input, and an op-amp output coupled to the drive gate; and
a low-pass filter coupled between the drive drain and the inverting input.

20. The RF switch of claim 19 wherein the drive FET is an n-channel FET.

21. The RF switch of claim 20 wherein the first fixed voltage node is at a negative potential with respect to a ground node.

* * * * *

UNITED STATES PATENT AND TRADEMARK OFFICE
CERTIFICATE OF CORRECTION

PATENT NO. : 10,270,437 B2
APPLICATION NO. : 15/294337
DATED : April 23, 2019
INVENTOR(S) : Baker Scott et al.

It is certified that error appears in the above-identified patent and that said Letters Patent is hereby corrected as shown below:

In the Specification

In Column 5, Line 46, replace "$R_{COMP}=R_{CM}*I_{BD}I_{MIRROR}$" with --$R_{COMP}=R_{CM}*I_{BD}/I_{MIRROR}$--.

Signed and Sealed this
Fourth Day of June, 2019

Andrei Iancu
*Director of the United States Patent and Trademark Office*